United States Patent
Lam et al.

(10) Patent No.: US 8,804,136 B2
(45) Date of Patent: Aug. 12, 2014

(54) APPARATUS AND METHOD FOR LOCATING A PLURALITY OF PLACEMENT POSITIONS ON A CARRIER OBJECT

(71) Applicants: Kui Kam Lam, Kwai Chung (HK); Yen Hsi Tang, Kwai Chung (HK); Wenling Chan, Kwai Chung (HK); Shun Ming Fung, Kwai Chung (HK)

(72) Inventors: Kui Kam Lam, Kwai Chung (HK); Yen Hsi Tang, Kwai Chung (HK); Wenling Chan, Kwai Chung (HK); Shun Ming Fung, Kwai Chung (HK)

(73) Assignee: ASM Technology Singapore Pte Ltd, Singapore (SG)

( * ) Notice: Subject to any disclaimer, the term of this patent is extended or adjusted under 35 U.S.C. 154(b) by 0 days.

(21) Appl. No.: 13/706,418

(22) Filed: Dec. 6, 2012

(65) Prior Publication Data
US 2014/0160492 A1    Jun. 12, 2014

(51) Int. Cl.
*G01B 11/14* (2006.01)
(52) U.S. Cl.
CPC ..................................... *G01B 11/14* (2013.01)
USPC .......................................................... 356/614
(58) Field of Classification Search
CPC ..................................................... G01B 11/14
USPC .................................................. 356/614–625
See application file for complete search history.

(56) References Cited

U.S. PATENT DOCUMENTS

| | | | | |
|---|---|---|---|---|
| 5,291,375 A * | 3/1994 | Mukai | ........................... | 361/760 |
| 5,463,227 A * | 10/1995 | Stern et al. | ............... | 250/559.29 |
| 6,024,449 A * | 2/2000 | Smith | ........................... | 351/212 |
| 6,525,810 B1 * | 2/2003 | Kipman | ..................... | 356/237.1 |
| 6,646,271 B2 * | 11/2003 | Yokokawa et al. | ......... | 250/458.1 |
| 7,224,474 B2 * | 5/2007 | Chuang et al. | ................ | 356/614 |
| 7,443,508 B1 * | 10/2008 | Vrhel et al. | .................. | 356/446 |
| 7,619,740 B2 * | 11/2009 | Kuusela | ....................... | 356/445 |
| 7,646,494 B2 * | 1/2010 | Lechuga Gomez et al. | .. | 356/622 |
| 7,991,219 B2 * | 8/2011 | Marumo | ...................... | 382/151 |
| 8,107,089 B2 * | 1/2012 | Jokinen | ......................... | 356/623 |
| 2005/0025353 A1* | 2/2005 | Kaneko et al. | ................ | 382/152 |
| 2007/0103688 A1* | 5/2007 | Kuusela | ....................... | 356/429 |

* cited by examiner

*Primary Examiner* — Sang Nguyen
(74) *Attorney, Agent, or Firm* — Ostrolenk Faber LLP

(57) ABSTRACT

Disclosed is an optical apparatus for locating a plurality of placement positions on a carrier object. The optical apparatus comprises: i) an imaging device having a plurality of imaging sensors, each imaging sensor being operative to capture an image of a part of a selected row of placement positions on the carrier object and the plurality of imaging sensors defining a combined field of view that includes all the selected row of placement positions; ii) a positioning device coupled to the imaging device, the positioning device being operative to position the imaging device relative to successive rows of placement positions on the carrier object; and iii) a processor connected to the imaging device and which is configured to receive the images captured by the plurality of imaging sensors for image processing in order to identify exact locations of the placement positions comprised in the selected row of placement positions. A method of locating a plurality of placement positions on a carrier object is also disclosed.

19 Claims, 4 Drawing Sheets

APPARATUS AND METHOD FOR LOCATING A PLURALITY OF PLACEMENT POSITIONS ON A CARRIER OBJECT

FIELD OF THE INVENTION

This invention relates to an optical apparatus particularly, but not exclusively, for locating a plurality of placement positions on a carrier object, such as a lead frame on which semiconductor dies may be bonded. The invention also relates to a method of locating a plurality of placement positions on a carrier object, such as a lead frame.

BACKGROUND OF THE INVENTION

Panning and zooming functions are usually provided in a conventional imaging system in order to capture a desired region of interest. Panning of the imaging system may involve moving the imaging system on an XY-plane in order to capture different parts of the desired region of interest. On the other hand, zooming of the imaging system may involve adjusting the internal mechanical assembly of the imaging system to vary a distance between the imaging system and the region of interest and/or the overall focal length of the imaging system, to thereby enlarge an image of the region of interest.

Invariably, the panning and zooming functions of the conventional imaging system require physical movement of either the whole or a part of the imaging system, or an object being inspected. However, the time required to move the whole of the imaging system also includes time for stabilising the imaging system or object at a resting positing, which may require tens of milliseconds, perhaps more. This might undesirably affect the overall throughput capacity among high-speed applications. Further, adjustment of the internal mechanical assembly of the imaging system may cause a shift of the optical centre of the imaging system, such that an allowable threshold—especially among high-accuracy applications—may be exceeded. In addition, the movement of the imaging system may also render the precise control of the imaging system's zooming capability hard to achieve among applications that require machine portability.

It is therefore an object of the present invention to seek to provide an apparatus that addresses, or at least ameliorates, some of the problems encountered by the conventional imaging system, and to provide the general public with a useful choice.

SUMMARY OF THE INVENTION

A first aspect of the invention is defined in claim 1. In particular, each of the plurality of imaging sensors comprised in the imaging device is configured to capture an image of a part of a selected row of placement positions on the carrier object and the plurality of imaging sensors defining a combined field of view that includes all of the selected row of placement positions. By requiring the combined field of view of the plurality of imaging sensors to cover an entire row of placement positions on the carrier object, the entire row of placement positions can be imaged without moving the imaging sensors along the row of placement positions. Advantageously, the efficiency of placement operations of objects onto a carrier object can be increased.

A second aspect of the invention is defined in claim 13. By using each imaging sensor to capture an image of a part of the selected row of placement positions on the carrier object, wherein the plurality of imaging sensor define a combined field of view that includes all the selected row of placement positions, the entire row of placement positions can be imaged without moving the imaging sensors along the row of placement positions. Advantageously, the efficiency of placement operations of objects onto a carrier object can be increased.

Some optional features/steps of the invention are defined in the dependent claims.

BRIEF DESCRIPTION OF THE DRAWINGS

Preferred embodiments of the invention will now be described, by way of example only, with reference to the accompanying drawings, of which.

DETAILED DESCRIPTION OF THE PREFERRED EMBODIMENTS

Figure 1:
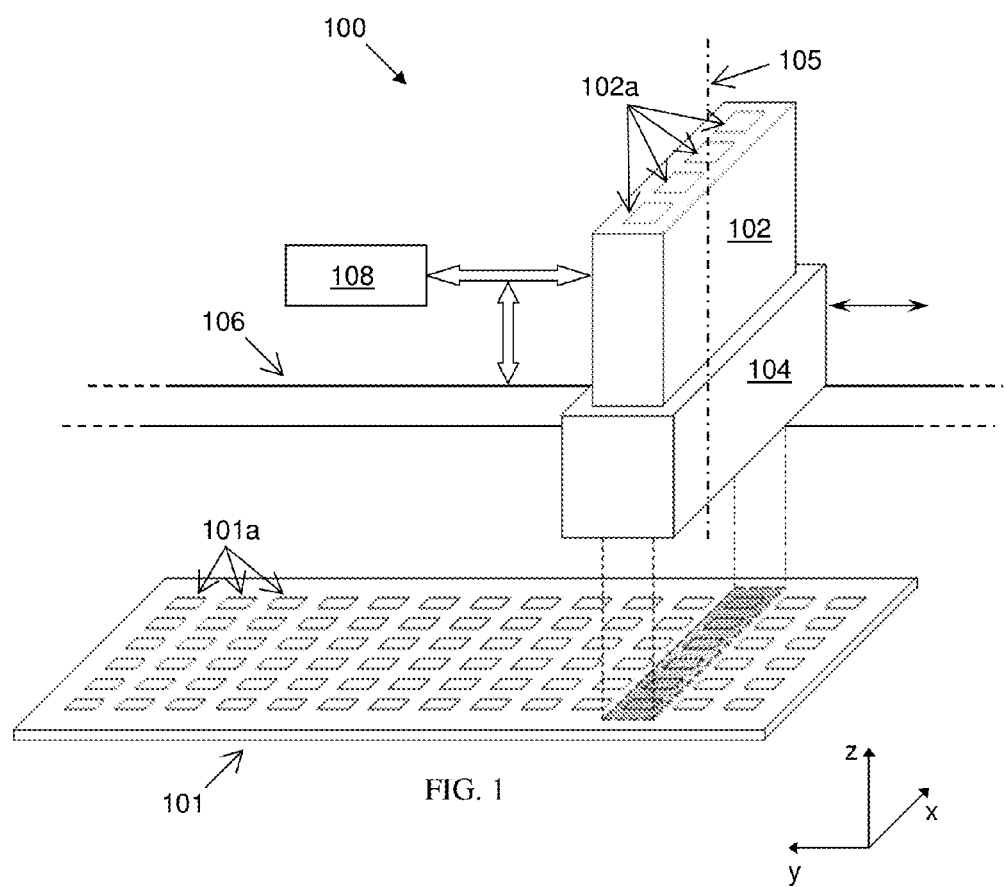
FIG. 1 shows an optical apparatus according to a preferred embodiment of the invention arranged in relation to a semiconductor die carrier for imaging respective rows of placement positions thereon.

FIG. 1 shows an optical apparatus 100 arranged with respect to a target object, which is shown as a semiconductor die carrier in the form of a lead frame 101 comprising a plurality of placement positions 101a, each for receiving a semiconductor die (not shown). In particular, the placement positions 101a of the lead frame 101 are arranged in an array defining rows and columns in an ordered fashion.

Specifically, the optical apparatus 100 comprises: i) an imaging device 102; ii) a light box 104 attached to the imaging device 102; iii) a positioning device (shown as a Y-arm 106) to which the imaging device 102 and the light box 104 are connected; and iv) a processor 108 for processing the images taken by the imaging device 102 and for controlling the imaging device 102, the light box 104, and the Y-arm 106.

The imaging device 102 and the light box 104 both define a common longitudinal axis 105, which extends perpendicularly with respect to an XY-plane on which the lead frame 101 is located. The imaging device 102 and the light box 104 are actuated by the Y-arm 106 to capture different regions of interest at the top of the lead frame 101. Moreover, the imaging device 102 comprises a plurality of imaging sensors 102a—in particular four imaging sensors 102a as shown in the embodiment illustrated in FIG. 1—to capture images of respective rows of placement positions 101a on the lead frame 101. More specifically, the imaging sensors 102a are aligned on the imaging device 102 such that the imaging sensors 102a defines a combined field of view that includes all of a selected row of the placement positions 101a. When the light box 104 is activated, light is directed towards the respective regions of interest to increase their brightness before the imaging sensors 102a are activated to capture the images. Preferably, each of the imaging sensors 102a has a resolution of at least 4.9 megapixels. This means that the imaging sensors 102a are capable of capturing images with an exemplary resolution of at least 2560 pixels by 1920 pixels (i.e. 2560×1920≈4.9 megapixels). Nevertheless, it should be appreciated that other imaging sensors having different resolutions (e.g. 1.9 megapixels or 7.2 megapixels) may also be used for the optical apparatus 100.

During operation, the processor 108 controls the Y-arm 106 to position the imaging device 102 such that the imaging sensors 102*a* are arranged to view an entire first row of placement positions 101*a* on the lead frame 101 for imaging. In particular, the imaging sensors 102*a* are arranged directly above the first row of placement positions 101*a*. After imaging of the first row of placement positions 101*a* on the lead frame 101 is completed, the Y-arm 106 is actuated to index the imaging device 102 and the light box 104 such that the imaging sensors 102*a* are positioned to view an entire second row of placement positions 101*a* on the lead frame 101—which is immediately adjacent to the first row of placement positions 101*a*-before the imaging sensors 102*a* are activated to image the second row of placement positions 101*a*. Similarly, the imaging sensors 102*a* are arranged directly above the second row of placement positions 101*a* for imaging. At the same time, the processor 108 is operative to process images that are captured by the imaging sensors 102*a* to locate the corresponding placement positions 101*a* on the lead frame 101 using known pattern recognition techniques. This continues until each successive row of placement positions 101*a* of the lead frame 101 has been imaged by the imaging device 102, and all the placement positions 101*a* have been accordingly located by the processor 108.

Preferably, some or all of the imaging sensors 102*a* are simultaneously activated when imaging respective rows of the placement positions 101*a* on the lead frame 101. Nevertheless, the imaging sensors 102*a* may also be sequentially activated when imaging respective rows of the placement positions 101*a*.

It should be appreciated that by arranging the plurality of imaging sensors 102*a* to view respective rows of placement positions 101*a* of the lead frame 101, entire rows of the placement positions 101*a* can be imaged without moving of the imaging device 102 and the light box 104 along the X-axis, besides the Y-axis. In contrast, movement of a conventional imaging system with respect to the lead frame 101 along the X-axis—in addition to the Y-axis—will be necessary in order to capture images of an entire row of the placement positions 101*a*, which undesirably reduces the throughput capacity of bonding operations of semiconductor dies due to increased motion and settling time.

It should also be appreciated that although it has been shown that the imaging device 102 comprises four imaging sensors 102*a*, the imaging device 102 may include any number of imaging sensors 102*a*. Preferably, the imaging device 102 comprises between 1 and 25 imaging sensors 102*a*. Further, the imaging device 102 may comprise an array arrangement of imaging sensors 102*a* arranged in rows and columns within the imaging device 102, instead of only a single row of imaging sensors 102*a*, as shown in FIG. 1. For instance, in the case whereby the imaging device 102 comprises 25 imaging sensors 102*a*, the imaging sensors 102*a* may be arranged in a 5×5 format.

Figure 2A:
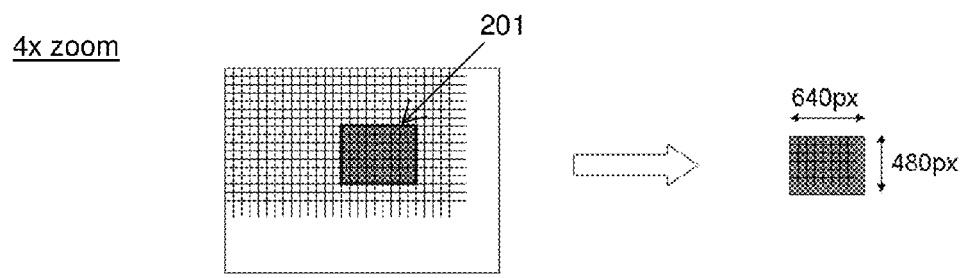
FIGS. 2a to 2c show three modes of a zooming function of the optical apparatus of FIG. 1.
Figure 2B:
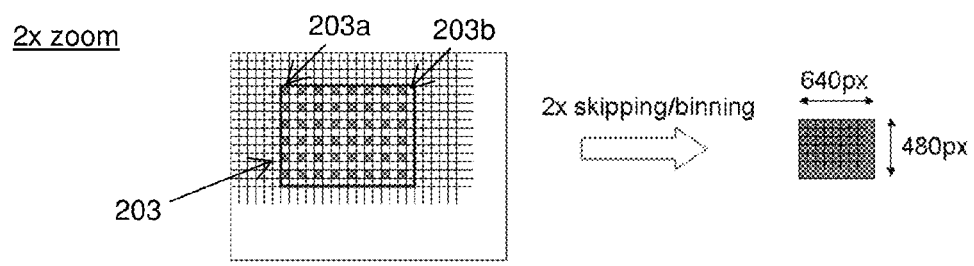
Figure 2C:
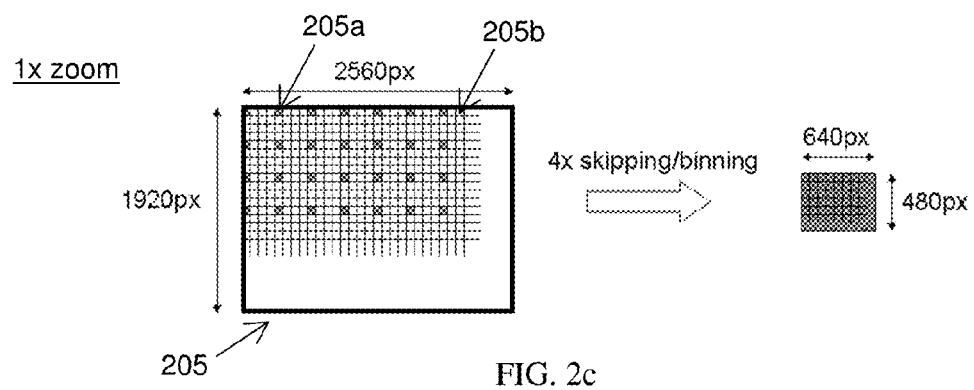

FIGS. 2*a-c* show three modes of the zooming function of the optical apparatus 100 of FIG. 1. For these three operation modes, instead of transferring entire images—each having a resolution of 2560×1920 pixels—as taken by each of the imaging sensors 102*a* to the processor 108 for image processing, sampled image portions each having a fixed data packet size that measures 640×480 pixels are selected and received by the processor 108 from the respective imaging sensors 102*a* for image processing. Thus, the processing speed of the optical apparatus 100 can be advantageously increased. It should, of course, be appreciated that other data packet sizes of each sample image portion may also be transmitted from the imaging sensors 102*a* to the processor 108 depending on the resolution requirements of the particular application.

FIG. 2*a* shows the optical apparatus 100 in a 4× zoom mode, to provide the best zoomed-in capability with the highest image resolution. Image resolution refers to the clarity or sharpness of a sampled image. In this 4× zoom mode, an inspected area 201 measuring 640×480 pixels of a captured image is first identified by the processor 108 before it samples every pixel along each row of the inspected area 201. In other words, there is no downsampling of the inspected area 201 (i.e. the sampled image portion) or the downsampling factor is 0.

FIG. 2*b* shows the optical apparatus 100 in a 2× zoom mode, to provide the second best zoomed-in capability with the next highest image resolution. In this 2× zoom mode, an inspected area 203 measuring 1280×960 pixels from the captured image is first identified by the processor 108. In particular, each row of the inspected area 203 comprised sampled pixels 203*a* (which are sampled by the processor 108) and skipped pixels 203*b* (which are skipped by the processor 108). Specifically, for every sampled pixel 203*a* along each row of the inspected area 203 that is sampled by the processor 108, the next immediate pixel constitutes a skipped pixel 203*b* that is not sampled by the processor 108. This means that the processor 108 downsamples (or subsamples) the inspected area 203 (i.e. the sampled image portion) of the captured image by a factor of 2. Consequently, the inspected area 203 in the 2× zoom mode is larger than the inspected area 201 in the 4× zoom mode. This also means that the processor 108 samples data of a fixed data packet size measuring 640×480 pixels, notwithstanding the inspected area 203 having an area that is twice larger than the inspected area 201 in the 4-× zoom mode.

FIG. 2*c* shows the optical apparatus 100 in a 1× zoom mode, to provide a zoomed-out capability with the lowest image resolution. In this 1× zoom mode, an inspected area 205 that is identified by the processor 108 actually constitutes the entire captured image that measures 2560×1920 pixels. Similarly, each row of the inspected area 205 comprised sampled pixels 205*a* (which are sampled by the processor 108) and skipped pixels 205*b* (which are skipped by the processor 108). Specifically, for every sampled pixel 205*a* along each row of the inspected area 205 that is sampled by the processor 108, the next three immediate pixels constitute skipped pixels 205*b* that are not sampled by the processor 108. This means that the processor 108 downsamples (or subsamples) the entire image by a factor of 4. Since the inspected area 205 covers the area of the entire image as captured by the imaging sensors 102*a*, the inspected area 205 is thus twice larger than the inspected area 203 in the 2× zoom mode and four times larger than the inspected area 201 in the 4× zoom mode. Again, the processor 108 samples data of a fixed data packet size measuring 640×480 pixels, despite the inspected area 205 being larger than the inspected areas 201, 203 in the 4× and 2× zoom modes respectively.

It should therefore be noted that the areas and image resolutions of the respective inspected areas 201, 203, 205 have an inverse relation, in order to maintain a consistent rate of data transfer from the imaging device 102 to the processor 108. In other words, the larger the area 201, 203, 205 that is inspected, the lower will be the image resolution of the image that is transmitted to the processor 108. In particular, the processor 108 is configured to sample the inspected areas 201, 203, 205 at a pixel sampling rate that decreases with an increase in the size of the same. It should also be noted that although three modes of the zooming function have been described, it should be appreciated that the optical apparatus 100 may comprise any number of modes depending on the application requirements.

Figure 3A:
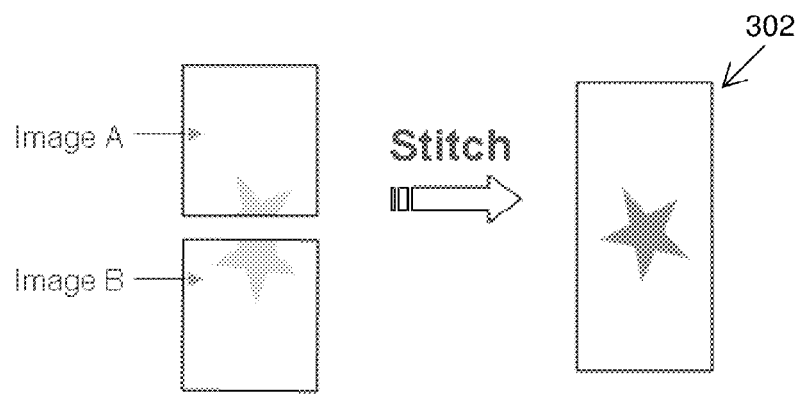
FIGS. 3a and 3b show a stitching function of the optical apparatus of FIG. 1.
Figure 3B:
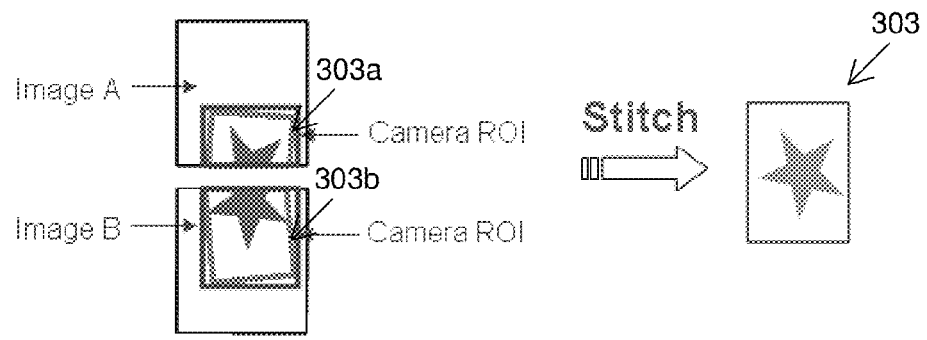

FIGS. 3a and 3b show a stitching function of the optical apparatus 100 of FIG. 1.

FIG. 3a shows two separate images—Image A and Image B—which are taken by two different imaging sensors 102a and are subsequently sent to the processor 108 for image processing. Before the processor 108 begins image analysis, it performs image stitching of Images A and B to combine them into a single image 302. Although FIG. 3a only shows image stitching of two images, it should again be appreciated that the processor 108 may perform image stitching of any number of images, particularly depending on the number of imaging sensors 102a in the imaging device 102 as well as the required field of view in order to image the target object. For instance, if there are four imaging sensors 102a, the processor 108 may image stitching of four separate images that have been captured by the respective imaging sensors 102a to form a single image.

More preferably, the processor 108 may be capable of identifying and selecting a region of interest from each of Images A and B before performing image stitching of the corresponding regions of interest. Referring to FIG. 3b, corresponding regions of interest 303a, 303b are identified and selected from Images A and B respectively, before these selected regions of interest 303a, 303b are stitched together to form a single image 303. In this case, it is seen that only the relevant portions of Images A and B are identified by the processor 108 and sent thereto to shorten the time taken for data transfer between the imaging sensors 102a and the processor 108. It should be also appreciated that the regions of interests 303a, 303b may be derived from any one of the zooming operation modes as described above with reference to FIGS. 2a-2c.

With the plurality of imaging sensors 102a and the stitching function, the optical apparatus 100 is capable of capturing images having a larger field of view without the need for panning which typically requires physical movement of the imaging device 102. Consequently, additional motion and settling time for the imaging device 102 can be eliminated. This desirably improves the overall throughput for the bonding operations of semiconductor dies.

Figures 4A, 4B, 4C:
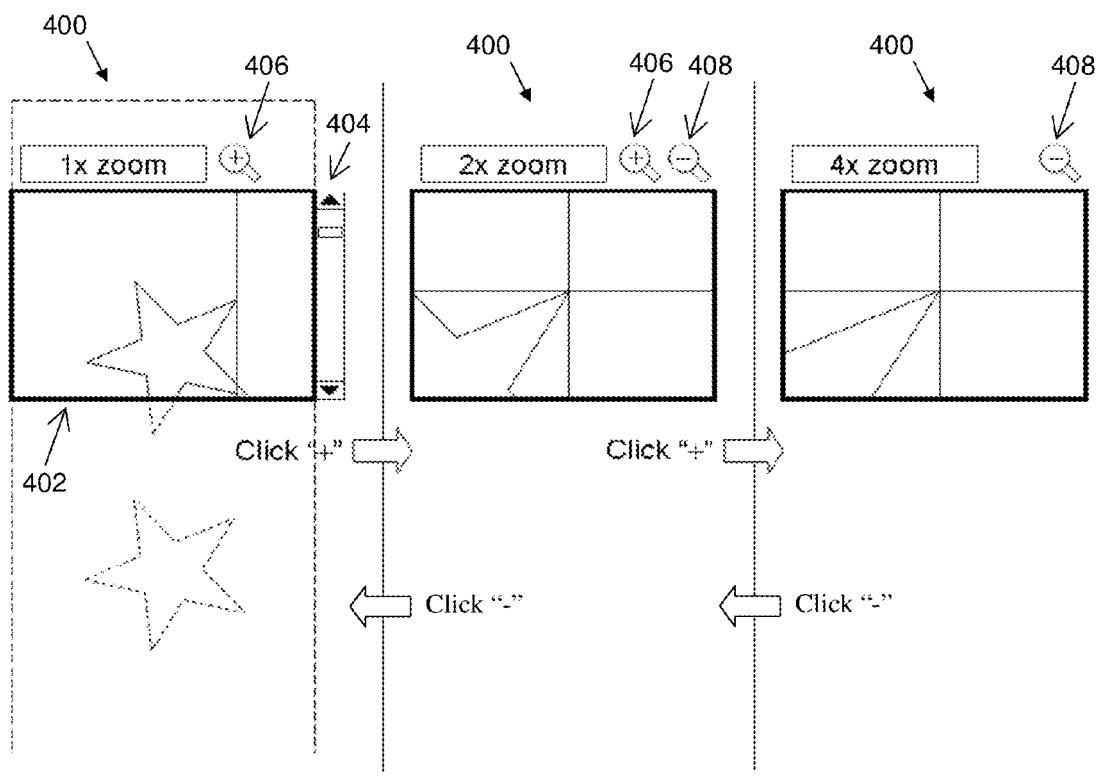
FIGS. 4a to 4c show a graphical user interface of the optical apparatus of FIG. 1.

With the zooming and stitching functions as described above, the images as captured by the imaging sensors 102a and processed by the processor 108 can be displayed to a user through a graphical user interface (GUI) 400 of the optical apparatus 100, as shown in FIGS. 4a to 4c.

Specifically, FIG. 4a shows the GUI 400 when the optical apparatus 100 is in the 1× zoom mode, wherein the zoomed-out image is displayed on a display area 402 of the GUI 400.

As the size of the zoomed-out image is larger than the display area 402, a vertical scroll bar 404 is provided on the right of the display area 402 to allow the user to adjust the position of the zoomed-out image within the display area 402. The vertical scroll bar 404 is controllable by a cursor of a computer mouse, but it should be appreciated that the GUI 400 may also be displayed on a touch screen that allows the user to control the vertical scroll bar 404 using finger touch.

Additionally, the GUI 400 includes a '+' zoom icon 406 for zooming into a specified portion of the zoomed-out image through an enhanced resolution when displayed on the display area 402. When the user clicks on the '+' zoom icon 406 with the computer mouse's cursor, the optical apparatus 100 transits into the 2× zoom mode such that a zoomed-in image having an enhanced image resolution is displayed on the display area 402 of the GUI 400, as shown in FIG. 4b. If the user further clicks on the '+' zoom icon 406 with the computer mouse's cursor, the optical apparatus 100 accordingly transits into the 4× zoom mode such that a further zoomed-in image of the specified image portion having a more enhanced image resolution is displayed on the display area 402 of the GUI 400, as shown in FIG. 4c. On the contrary, if the user clicks on a '−' zoom icon 408 on the GUI 400 as shown in FIG. 4b, the optical apparatus 100 transits back to the 1× zoom mode, such that the original zoomed-out image (as shown in FIG. 4a) is displayed on the display area 402 of the GUI 400. Likewise, if the user clicks on the '−' zoom icon 408 on the GUI 400 as shown in FIG. 4c, the apparatus 100 transits from the 4× zoom mode back to the 2× zoom mode as shown in FIG. 4b.

Having fully described the invention, it should be apparent to one of ordinary skill in the art that many modifications can be made thereto without departing from the scope as claimed. For instance, a die bonder for bonding semiconductor dies to the lead frame 101 may include the optical apparatus 100. Although the use of the optical apparatus 100 with respect to the lead frame 101 has been described, it should be appreciated that the optical apparatus 100 may also be used for other technologies. One example is in the area of surface mount technology (SMT) placement of electronic packages onto a printed circuit board (PCB), wherein the PCB is another configuration of the carrier object with a plurality of placement positions for receiving the electronic packages.

The invention claimed is:

1. An optical apparatus for locating a plurality of placement positions on a carrier object, the optical apparatus comprising:
   an imaging device comprising a plurality of imaging sensors, each imaging sensor being operative to capture an image of a part of a selected row of placement positions on the carrier object, and the plurality of imaging sensors defining a combined field of view that includes an entirety of the selected row of placement positions;
   a positioning device coupled to the imaging device, the positioning device being configured and operative to position the imaging device in a direction perpendicular to the selected row of placement positions relative to successive rows of placement positions on the carrier object; and
   a processor connected to the imaging device and which is configured to receive the images captured by the plurality of imaging sensors for image processing in order to identify exact locations of the placement positions comprised in the selected row of placement positions.

2. The optical apparatus of claim 1, wherein the plurality of imaging sensors are arranged in a row or in an array arrangement on the imaging device.

3. The optical apparatus of claim 1, wherein each of the plurality of imaging sensors has a resolution of at least 1.9 megapixels.

4. The optical apparatus of claim 1, wherein the imaging device comprises between 1 and 25 imaging sensors.

5. The optical apparatus of claim 1, wherein the processor is configured to receive the images from the imaging device in data packets having a fixed size.

6. The optical apparatus of claim 5, wherein the processor is operative to identify and select at least one image portion from a respective image that has been captured by one of the plurality of imaging sensors, and a size of the image portion is inversely related to a resolution of the image that is received by the processor so as to maintain a consistent rate of data transfer from the imaging device to the processor.

7. The optical apparatus of claim 6, wherein the processor is configured to sample a plurality of image portions at a pixel sampling rate that decreases with an increase in the size of the image portions.

8. The optical apparatus of claim 1, wherein the processor is further operative to stitch together separate images that have been captured by some or all of the plurality of imaging sensors to form a single image having an image area larger than that of each of the separate images that has been captured.

9. The optical apparatus of claim 8, wherein the processor is operative to identify and select regions of interest from some or all of the images, and to stitch together the regions of interest to form a single combined image having a combined image area larger than that of each of the selected regions of interest.

10. The optical apparatus of claim 1, further comprising a lighting device attached to the imaging device, the lighting device being operative to direct light towards the combined field of view of the plurality of imaging sensors to increase a brightness level of the selected row of placement positions.

11. The optical apparatus of claim 1, wherein the carrier object is a semiconductor die carrier configured to receive semiconductor dies during die bonding.

12. The optical apparatus of claim 1, wherein the carrier object is a printed circuit board configured to receive semiconductor packages during package placement.

13. A die bonder for bonding semiconductor dies to a semiconductor die carrier, the die bonder comprising the optical apparatus of claim 1.

14. A method of locating a plurality of placement positions on a carrier object, the method comprising the steps of:
  positioning an imaging device with respect to a selected row of placement positions on the carrier object using a positioning device to which the imaging device is coupled, wherein the imaging device comprises a plurality of imaging sensors;
  capturing an image of a part of the selected row of placement positions using each imaging sensor, the plurality of imaging sensors defining a combined field of view that includes an entirety of the selected row of placement positions;
  receiving the images captured by the plurality of imaging sensors by a processor;
  processing the captured images using the processor in order to identify exact locations of the placement positions of the selected row of placement positions; and
  repositioning the imaging device in a direction perpendicular to the selected row of placement positions with respect to a next selected row of placement positions on the carrier object using the positioning device.

15. The method of claim 14, wherein the step of receiving the images captured by the plurality of imaging sensors by the processor comprises the step of receiving the images in data packets having a fixed size from the imaging device by the processor.

16. The method of claim 15, wherein the step of receiving the images in data packets having a fixed size by the processor comprises the steps of identifying and selecting at least one image portion from a respective image that has been captured by one of the plurality of imaging sensors using the processor, wherein a size of the image portion is inversely related to a resolution of the image that is received by the processor so as to maintain a consistent rate of data transfer from the imaging device to the processor.

17. The method of claim 16, wherein the steps of identifying and selecting the plurality of image portions comprise the step of sampling a plurality of image portions by the processor at a pixel sampling rate that decreases with an increase in the size of the image portions.

18. The method of claim 14, further comprising the step of stitching together the images that have been captured by some or all of the plurality of imaging sensors using the processor to form a single image having an image area larger than that of each of the images that has been captured.

19. The method of claim 18, wherein the step of stitching together the images further comprises the steps of identifying and selecting regions of interest from some or all of the captured images, and stitching together the regions of interest to form a single combined image having a combined image area larger than that of each of the selected regions of interest.

* * * * *